United States Patent [19]

Garner et al.

[11] Patent Number: 4,642,877
[45] Date of Patent: Feb. 17, 1987

[54] METHOD FOR MAKING CHARGE COUPLED DEVICE (CCD)-COMPLEMENTARY METAL OXIDE SEMICONDUCTOR (CMOS) DEVICES

[75] Inventors: Ricky B. Garner, Garland; Thomas H. Payne, Plano; Farid M. Tranjan, Dallas, all of Tex.

[73] Assignee: Texas Instruments Incorporated, Dallas, Tex.

[21] Appl. No.: 750,364

[22] Filed: Jul. 1, 1985

[51] Int. Cl.$^4$ .......................................... H01L 21/263
[52] U.S. Cl. .................................. 29/571; 29/576 E; 357/24; 357/51
[58] Field of Search ................. 357/24; 29/571, 576 E

[56] References Cited

U.S. PATENT DOCUMENTS

| | | | |
|---|---|---|---|
| 3,865,652 | 2/1975 | Augusta et al. | 148/187 |
| 4,013,484 | 3/1977 | Boleky et al. | 148/1.5 |
| 4,063,992 | 10/1977 | Hosack | 156/653 |
| 4,099,317 | 7/1978 | Su | 29/571 |
| 4,229,752 | 10/1980 | Hynecek | 357/24 |
| 4,234,362 | 11/1980 | Riseman | 148/187 |
| 4,314,857 | 2/1982 | Aitken | 148/1.5 |
| 4,397,077 | 8/1983 | Derbenwick et al. | 29/571 |
| 4,471,368 | 9/1984 | Mohsen | 357/23 |

OTHER PUBLICATIONS

RCA Review, vol. 36, Sep. 1975, pp. 567–593, "Basic Concepts of Charge-Coupled Devices", Kosohocky et al.

Primary Examiner—Brian E. Hearn
Assistant Examiner—T. Quach
Attorney, Agent, or Firm—Richard K. Robinson; Leo N. Heiting; Melvin Sharp

[57] ABSTRACT

A charge transfer device (CTD)/complementary metal oxide semiconductor (CMOS) process for the production of a signal processing apparatus is disclosed. The process consists of selectively combining virtual phase CCD process technology with CMOS technology to provide high density signal processing utilizing small (3 micron) geometries, sized P and N MOS (CMOS) transistors, and high valued (0.8 picofarad) poly-poly capacitors. The process is a single and efficient (14–16 photomasks) fabrication process starting with a single layer of P+ silicon as a substrate supporting an epitaxial layer of P silicon as the active area. An N well is formed in the epitaxial surface for a P-channel MOSFET, then using a patterned moat and positive and negative resists boron is ion implanted to form channel separators between N and P channel transistors, and P+ isolation regions and channel stops for the CCDs. A first layer of poly silicon is deposited for a stacked capacitor and covered with oxide and nitride layers, and boron implants made to adjust the thresholds of N and P channels transistors and then buried channels for the CCDs are ion implanted. Then N-material is ion implanted to form clock wells. Next, a second level poly silicon layer is deposited and etched to form transistor gates; and CCD clock gates. Then N+ and P+ source and drain regions are formed to complete the CMOS circuitry. Then a N-virtual well is formed by ion implanting N-type material and the virtual phase region, barrier and well is deepended by another P-material implant. Finally, aluminum contacts for the CCDs, CMOS and poly-poly capacitors are formed.

19 Claims, 25 Drawing Figures

METHOD FOR MAKING CHARGE COUPLED DEVICE (CCD)-COMPLEMENTARY METAL OXIDE SEMICONDUCTOR (CMOS) DEVICES

BACKGROUND OF THE INVENTION

This invention relates to semiconductor devices and more particularly to a method for making charge coupled device-complementary metal oxide semiconductor (CCD-CMOS) devices.

In the past, signal processors comprised the combination of a virtual phase-buried channel CCD and either N channel or P channel metal oxide semiconductors (NMOS or PMOS) and their respective fabrication processes. The combination of a CCD and CMOS circuitry was precluded for many reasons, one reason was predicated on the high temperature anneals necessary for CMOS fabrication which are destructive of the CCD and the shorting problems associated with overlapping gates and multi phase CCDs. Those persons skilled in the art desiring detailed information concerning the prior art signal processor are referred to U.S. Pat. No. 4,229,752 issued Oct. 21, 1980 to J. Hynecek for "Virtual Phase Charge Transfer Device." Those persons desiring CMOS background information are referred to U.S. Pat. No. 4,442,591 issued Apr. 17, 1984 to Roger A. Haken for "High Voltage CMOS Process."

The problems attending the use of the prior art processors are, for example, their size per unit area for signal processing, the resulting signal degradation, noise, and marginal charge transfer efficiency (CTE) of the CCD for "imaging" arrays and signal conditioning and power consumption attending the use of NMOS or PMOS.

SUMMARY OF THE INVENTION

Accordingly it is an object of the present invention to provide a combined buried channel CCD-CMOS process.

Another object of the invention is to provide a combined buried channel CCD-CMOS process having maximal signal processing per unit area and substantially reduced signal degradation for advanced systems.

A further object of the invention is to provide a buried channel CCD-CMOS signal processor having a low noise, high charge transfer efficiency for signal conditioning.

Yet another object of the invention is to provide a buried channel CCD-CMOS process having substantially reduced power consumption.

Briefly stated the invention comprises a combined buried channel CCD-CMOS process. The combined buried channel CCD-MOS couples the low power requirements and needed design versatility of a double level poly silicon CMOS process with the high charge transfer efficiency and low transfer noise of the buried channel CCD. The buried channel CCD offers lower noise than a surface channel CCD or the more conventional bucket brigade devices which share the rather substantial noise problem associated with the fluctuations of charge retained in surface traps residing at the silicon dioxide interface, sizing constraints and second order effect problems such as cross-talk, latch-up, poly-poly shorts, etc.

With respect to the process for the combined buried channel CCD-CMOS signal processor, owing to the process flow's inherent complexity (high number of implants), the process allows for great flexibility in the fabrication of the CMOS transistors. Also, the use of two discrete poly depositions, provides the means for incorporating transistors having a range of threshold voltages. This flexibility makes the process available for other CMOS applications such as, for example, level translators and differential pair amplifiers. These CMOS applications can be utilized with the CCD fabrication for many signal processor applications.

BRIEF DESCRIPTION OF THE DRAWINGS

Other objects and features of the invention will become more readily apparent from the following detailed description when read in conjunction with the accompanying drawings, in which.

DESCRIPTION OF THE PREFERRED EMBODIMENT

Figure 1A:
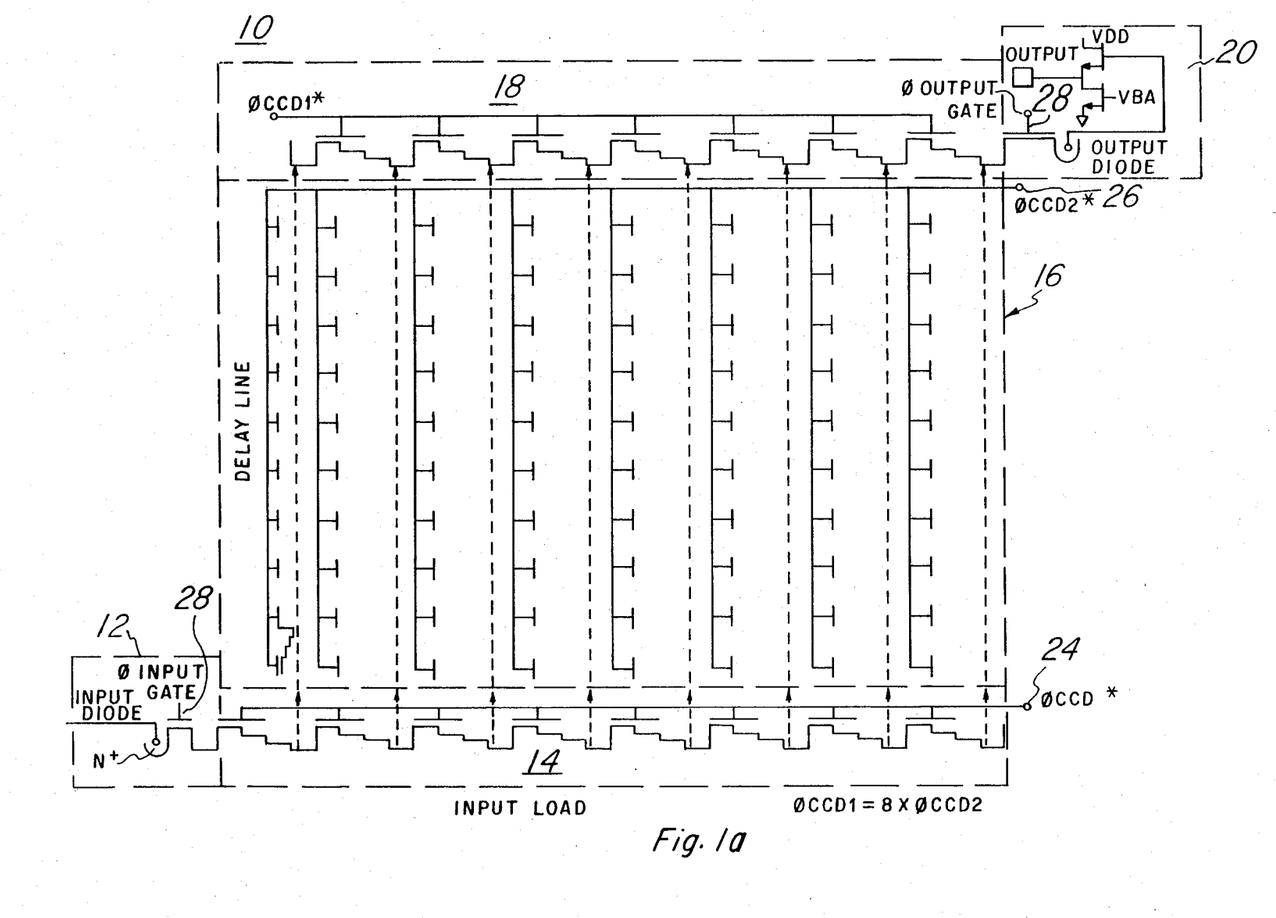
FIGS. 1a–1d are schematic diagrams, partly in block form of a serial read-parallel delay circuit including the buried channel CCD-CMOS signal processor including CCD input structure, TTL to CMOS level translator and CMOS shift register.

Referring now to FIG. 1a, the serial read-parallel delay circuit 10 includes a charge transfer MOS input gate 12 for loading information signals into an information serial load CCD channel 14. Load channel 14 inputs the information signals into an array of CCD delay lines 16 for read out by a serial output CCD channel 18 and an MOS readout circuit 20. A shift register 22 is connected by lead 24 (FIG. 1b) to the information serial load channel 14, by lead 26 to the array of CCD delay lines 16 and by lead 28 to the serial output CCD channel 18 and input channel 14 for driving the clocks thereof.

The shift register 22 (FIG. 1b) includes a plurality of CMOS delay stages 30. Each stage 30 (FIG. 1c) includes a first CMOS switch 32 and a first set of inverters 34, a second CMOS switch 36 and a second set of inverters 38. Each set of inverters includes CMOS transistors 40 and 42 and a capacitor 44. The first and second sets of inverters have feedback circuits 46 and 48 for feeding back an information signal for latching with the latest information signal. Feedback of the signals is controlled by CMOS switches 46 and 48.

Figure 1B:
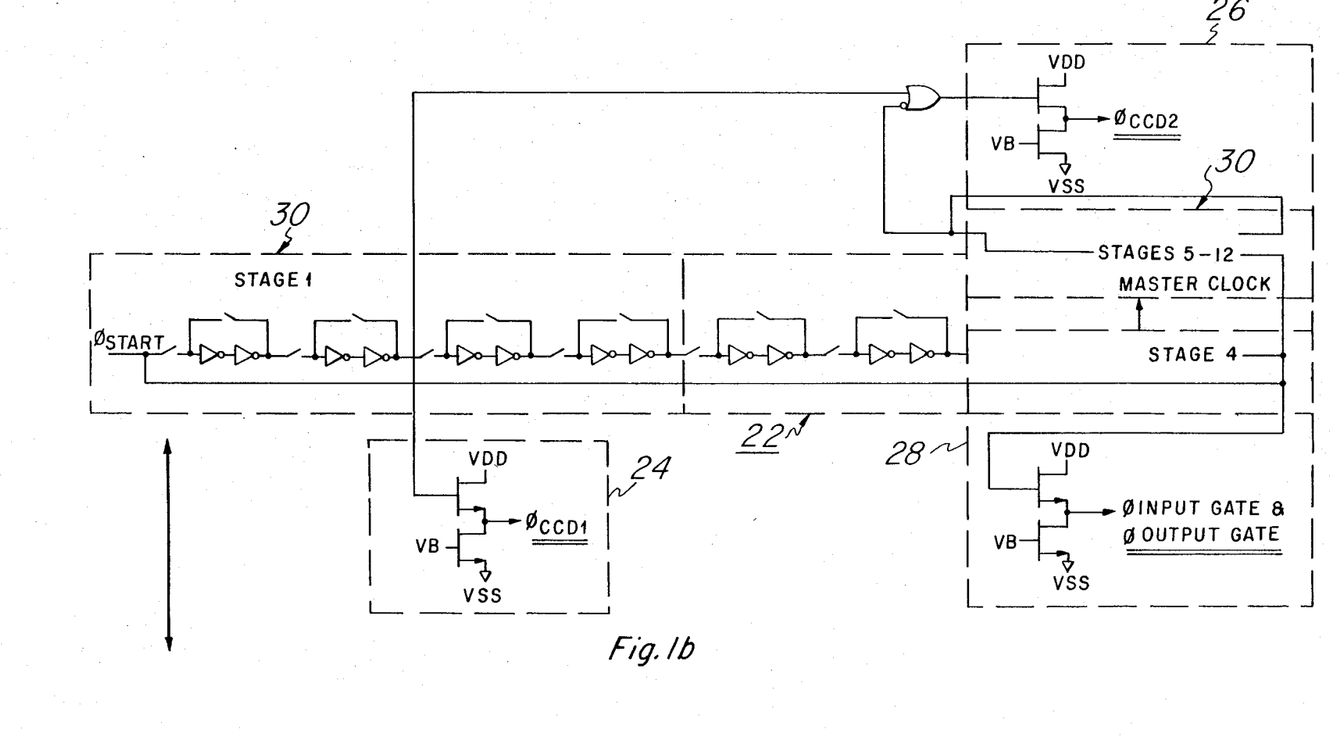

A master clock driver 50 (FIG. 1d) is connected to the switches 32, 36, 46 and 48 (FIG. 1c) of the sets of inverters 34 and 38 of shift register 22 (FIG. 1b).

The serial read-parallel delay circuit is fabricated as an integrated circuit using a virtual phase buried channel CCD/CMOS process.

EXAMPLE

Figure 2A:
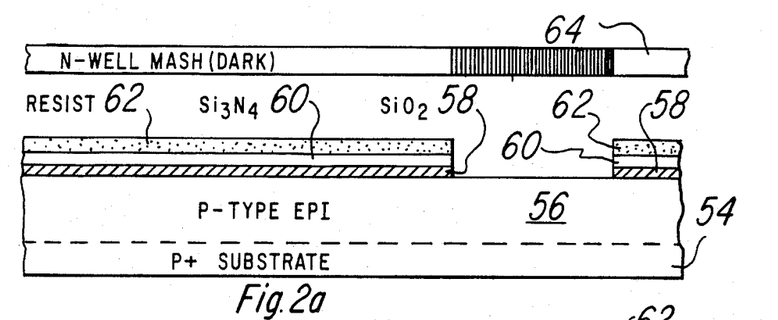
FIGS. 2a–2t illustrate in sequence the buried channel CCD-CMOS signal processor fabrication steps.
Figure 2B:
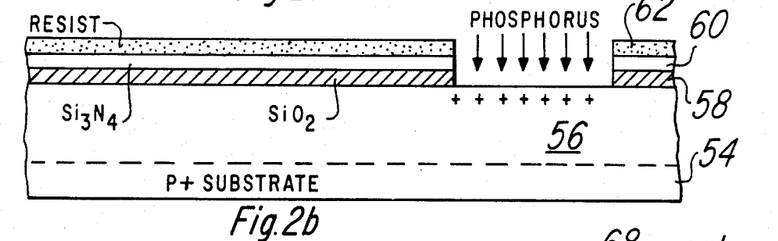
Figure 2C:
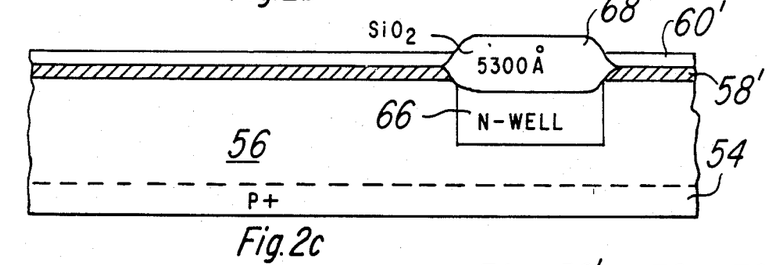
Figure 2D:
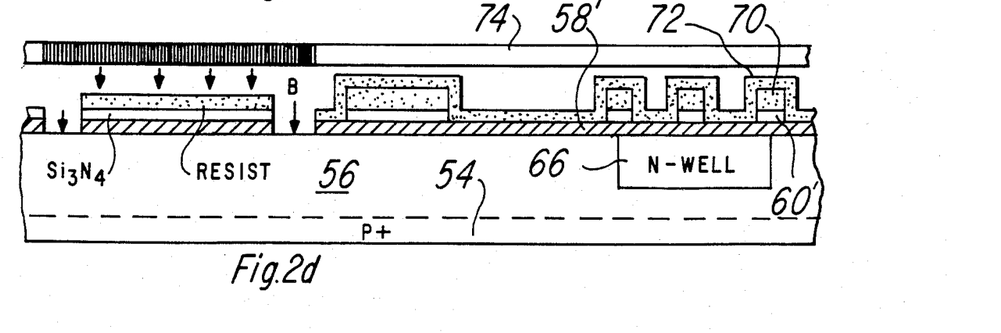
Figure 2E:
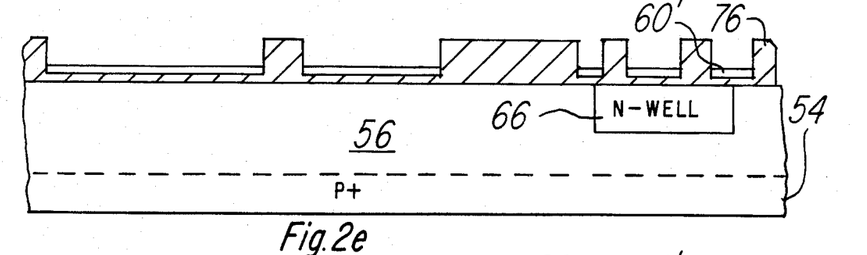
Figure 2F:
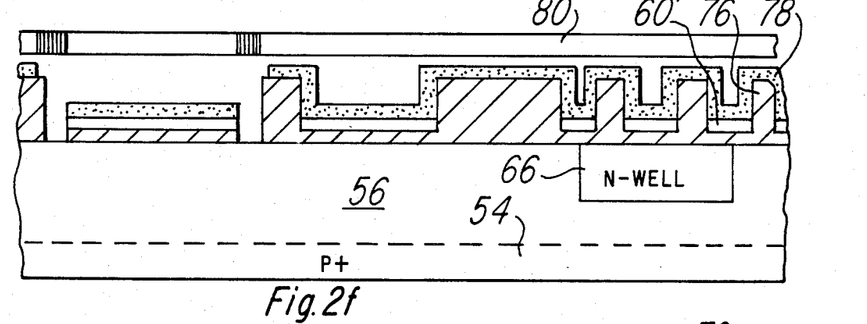
Figure 2G:
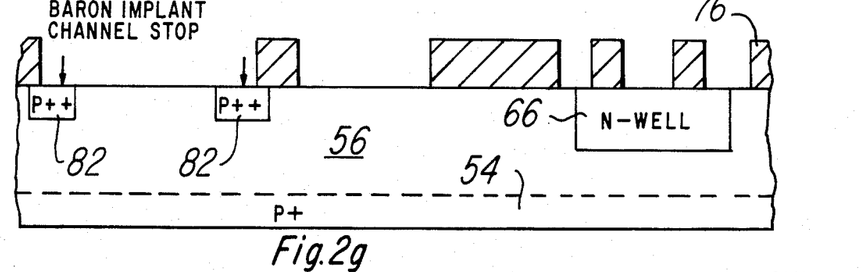
Figure 2H:
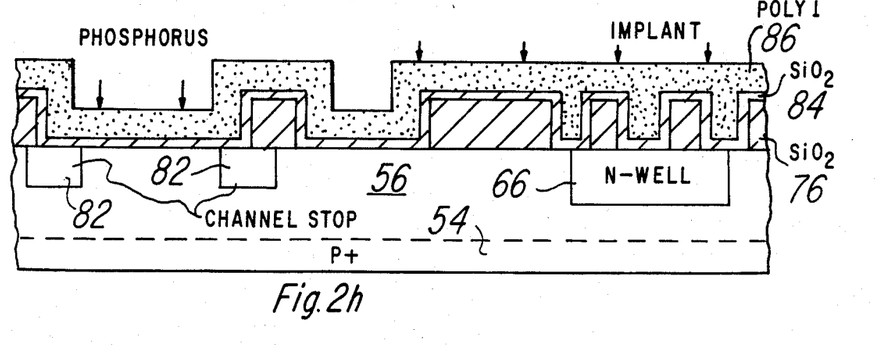
Figure 2I:
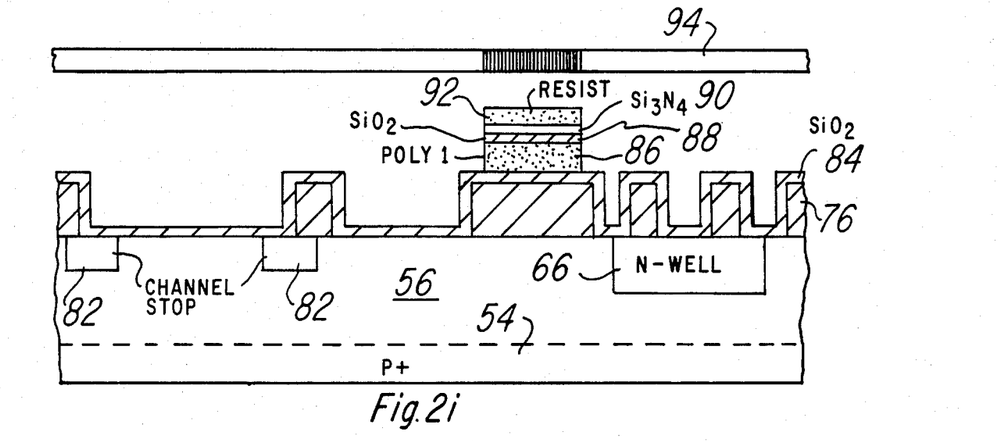
Figure 2J:
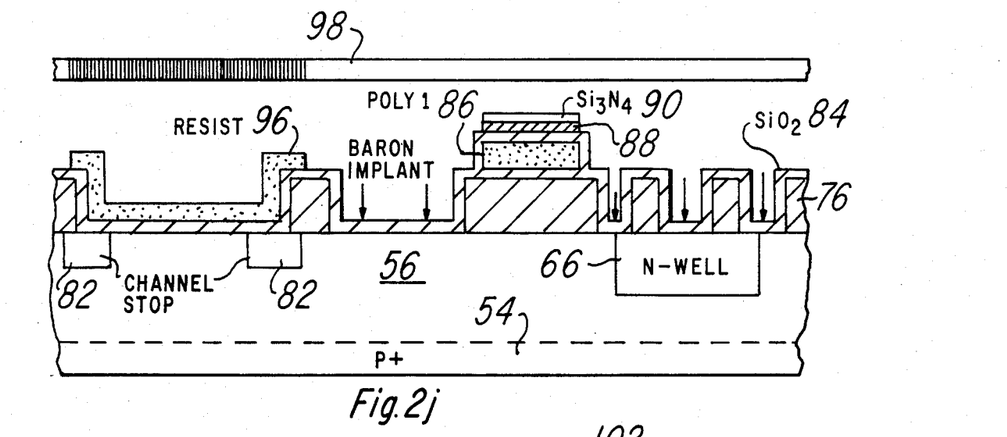
Figure 2K:
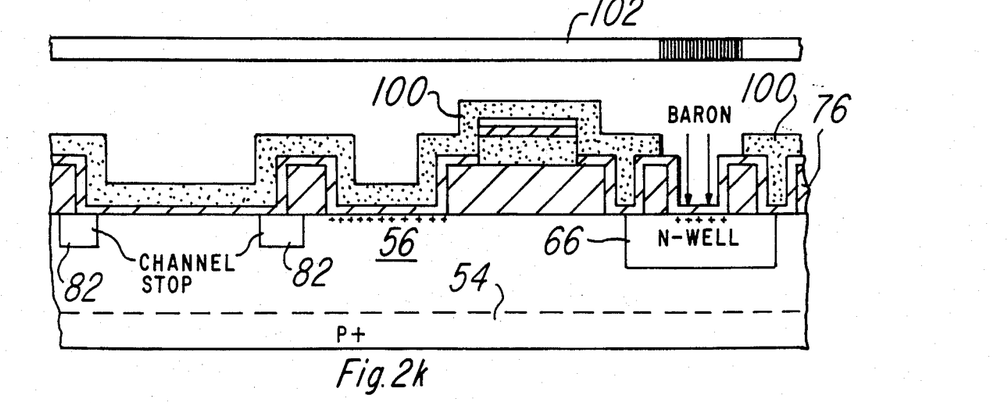
Figure 2L:
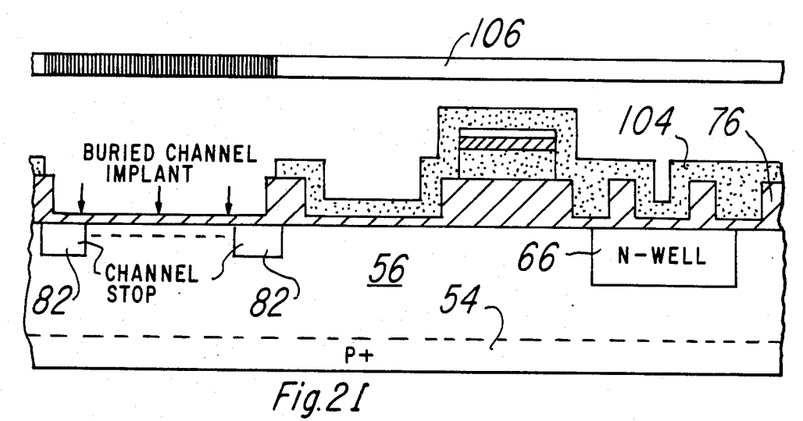
Figure 2M:
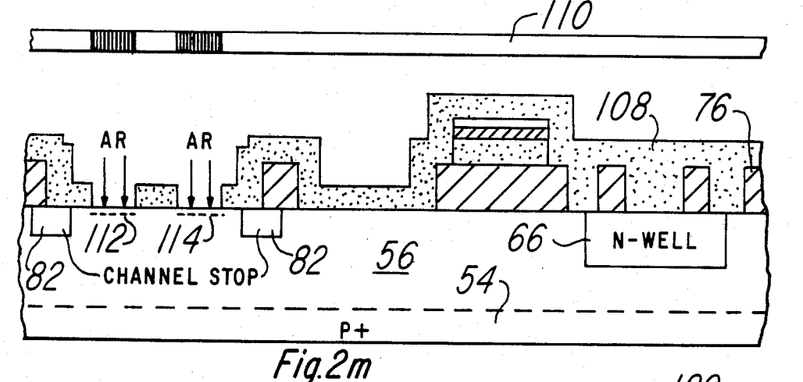
Figure 2N:
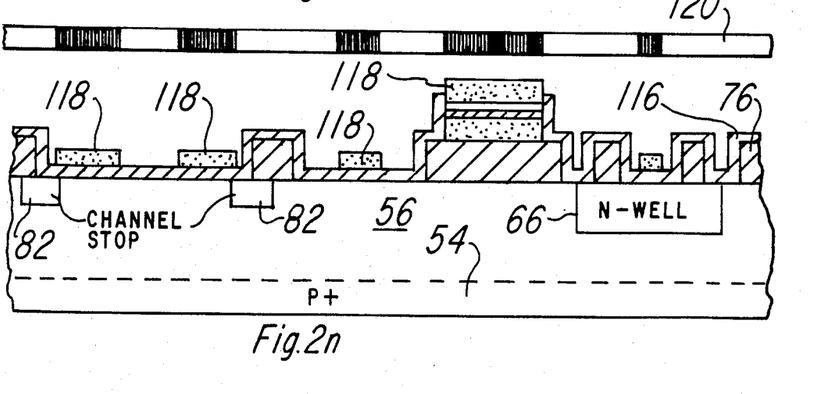
Figure 2O:
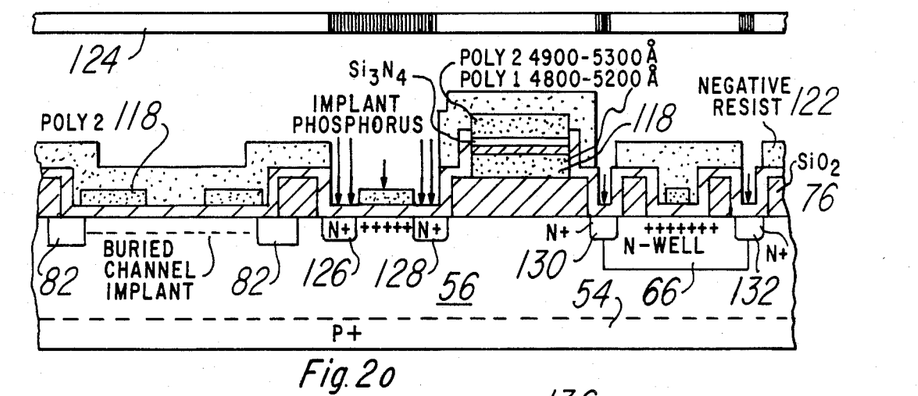
Figure 2P:
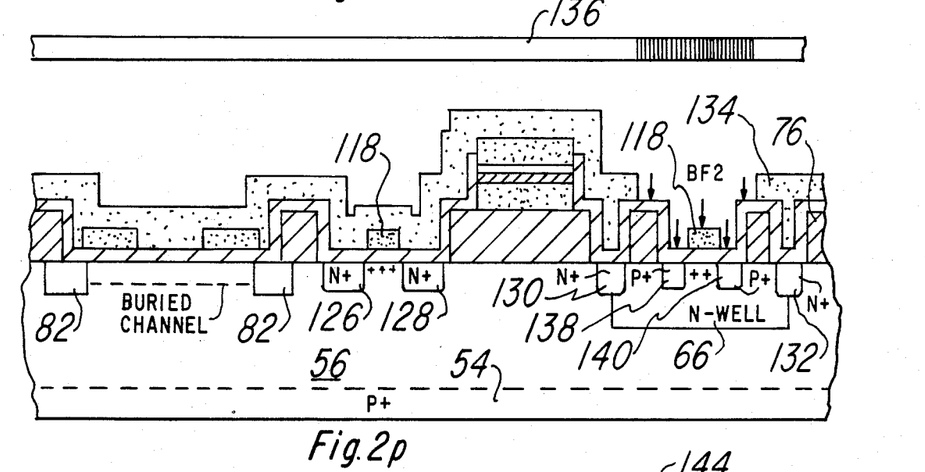
Figure 2Q:
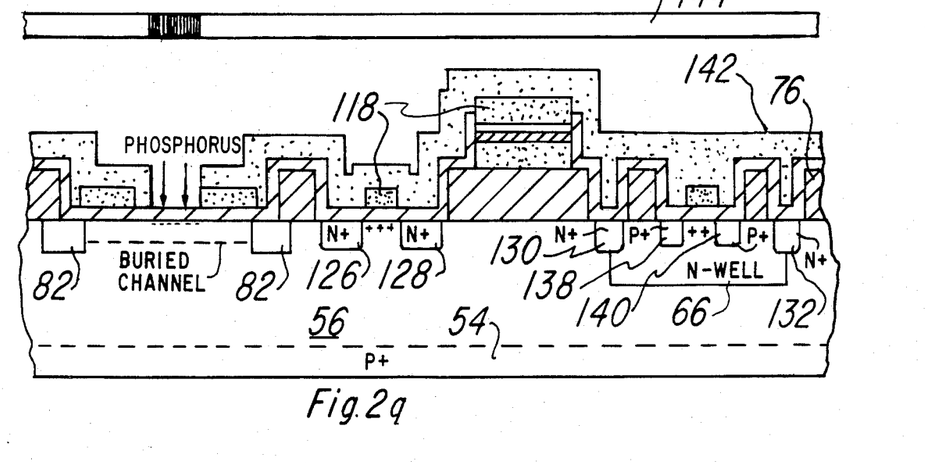
Figure 2R:
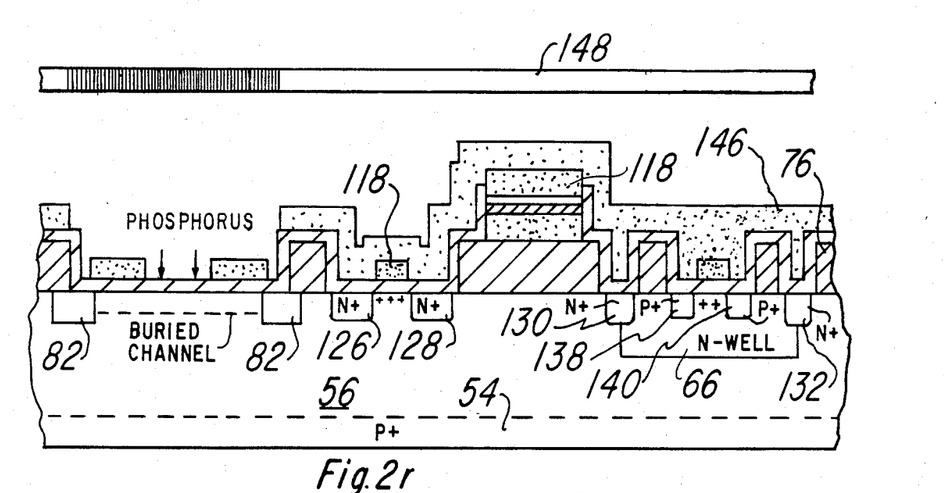
Figure 2S:
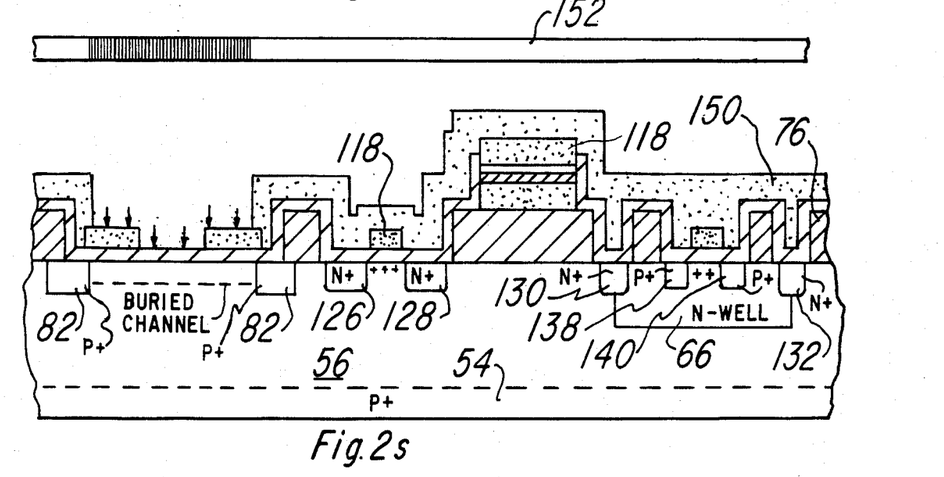
Figure 2T:
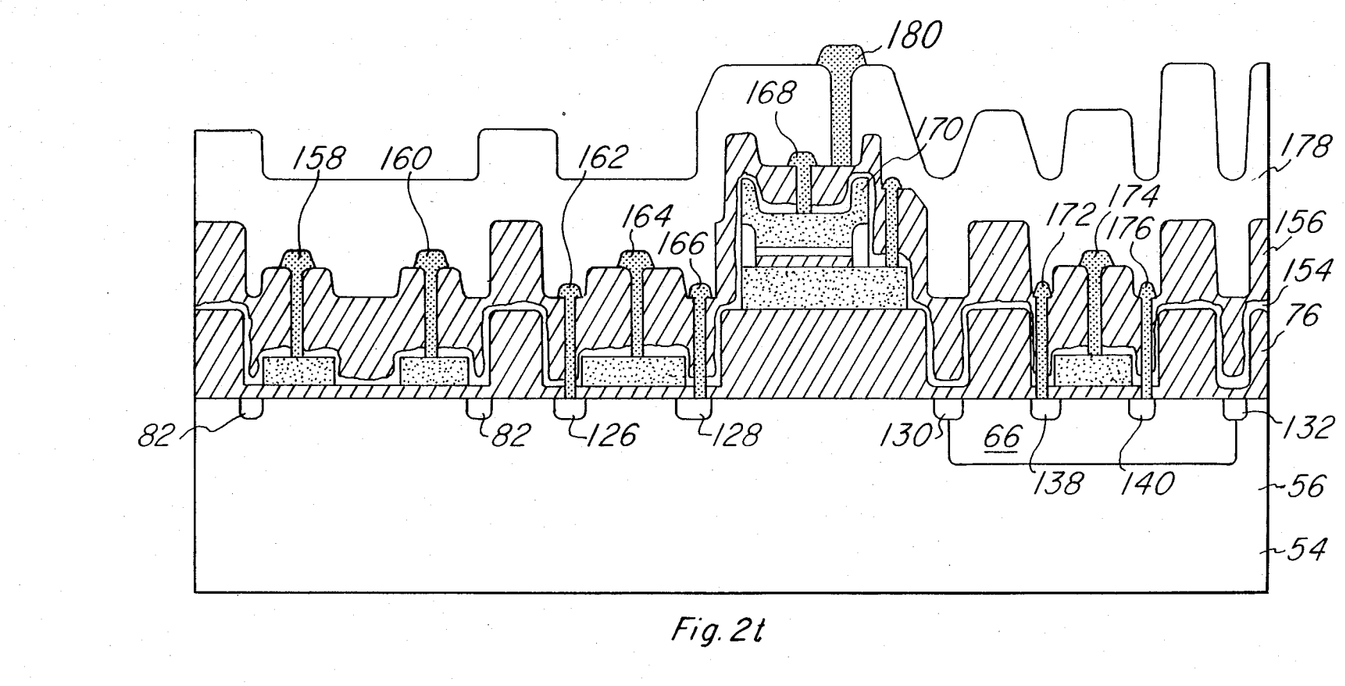

Referring now to FIGS. 2a–2t, the virtual phase N buried channel CCD-CMOS (BCCCD-CMOS), which is fabricated in accordance with the following example for description purposes and not by way of limitation, includes a 20 mil thick P+ Si substrate 54 (FIG. 2a) with a 14–16 micron P− type epitaxial layer 56 upon which is grown an 800 Angstrom thick layer 58 of $SiO_2$ having a 9–11 ohm/cm resistivity and oriented in the <100> plane. A 1400 Angstrom thick layer 60 of $Si_3N_4$ is deposited upon the oxide layer 58 and coated with a layer of photoresist 62. A dark N-well P-MOS defining mask 64 is used to expose the N-well pattern on the resist layer 62, after which the unexposed resist is washed away to expose a portion of the nitride layer 60.

Next, the exposed portion of the nitride layer 60 and corresponding portion of oxide layer 58 is etched away and n-type semiconductor material, preferably phosphorus, is ion implanted (FIG. 2b) to form an n-well 66 (FIG. 2c) for a p-channel MOSFET. The phosphorous implant is done at $5.5 \times 10^{12}/cm^3$ and 80 KeV energy. After implant, a 6000 Angstrom thick $SiO_2$ layer 68 is grown over the n-well 66 and the initial oxide and nitride layers 58 and 60 stripped.

A new 1100 Angstrom thick $SiO_2$ layer 58' is grown over the substrate and a new 1400 Angstrom thick $Si_3N_4$ layer 60' deposited on the oxide 58'. A patterned moat 70 (FIG. 2d) is patterned using resist and a moat mask (not shown) on the nitride and the nitride layer 60' etched. Then a negative photoresist layer 72 is processed using mask 74 to provide the CCD pattern after which p-type material such as, Boron, is ion implanted. This boron implant is done at $5.5 \times 10^{12}/cm^3$ and 90 KeV energy. The boron implant serves as channel separation between n and p channel transistors.

After the boron implant, the resist is stripped and 10,000 Angstrom field $SiO_2$ 76 grown (FIG. 2e).

Next, a layer of negative resist 78 is patterned using channel stop mask 80 (FIG. 2f) and the nitride layer 60' selectively etched. A P material (boron) is ion implanted at $1.0 \times 10^{14}$ and 60 KeV for forming P+ isolation regions and channel stops 82 (FIG. 2g) for the CCD. After clean up during which the photoresist patterned layer 78, nitride 60' and about 2000 Angstroms of oxide 58' are removed, and a high temperature anneal performed, a thin (550–650 Angstroms) $SiO_2$ layer 84 is grown over the surface and a 4800–5200 Angstrom layer 86 (FIG. 2h) of poly silicon deposited thereon. Then an n-type material (phosphorous) is ion implanted at $5.7 \times 10^{15}$ and 135 KeV into the poly silicon layer 86 to lower the poly sheet resistance.

Figure 1C:
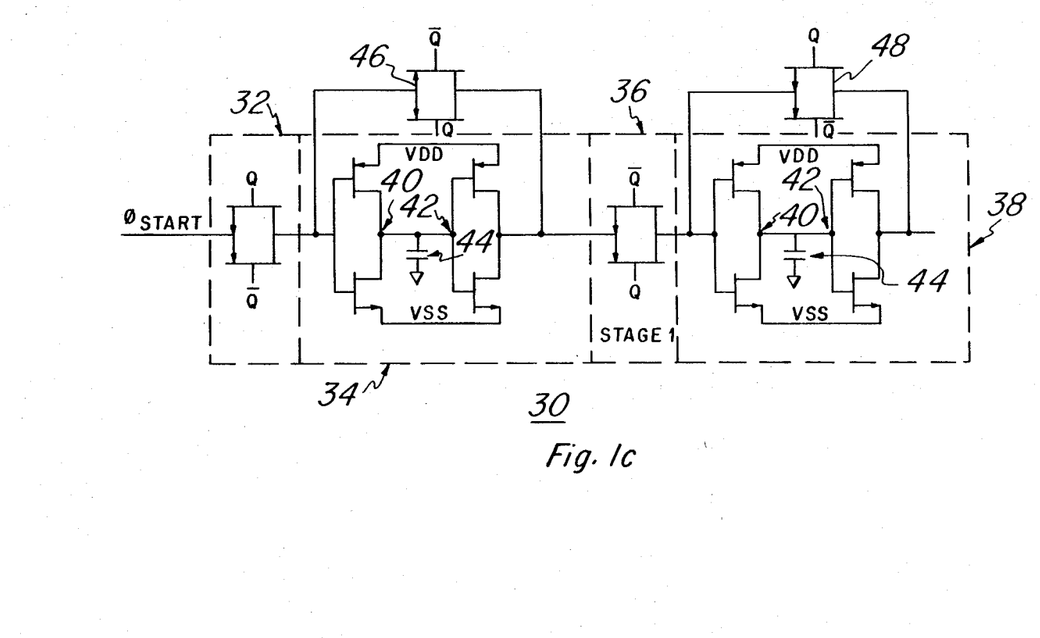
Figure 1D:
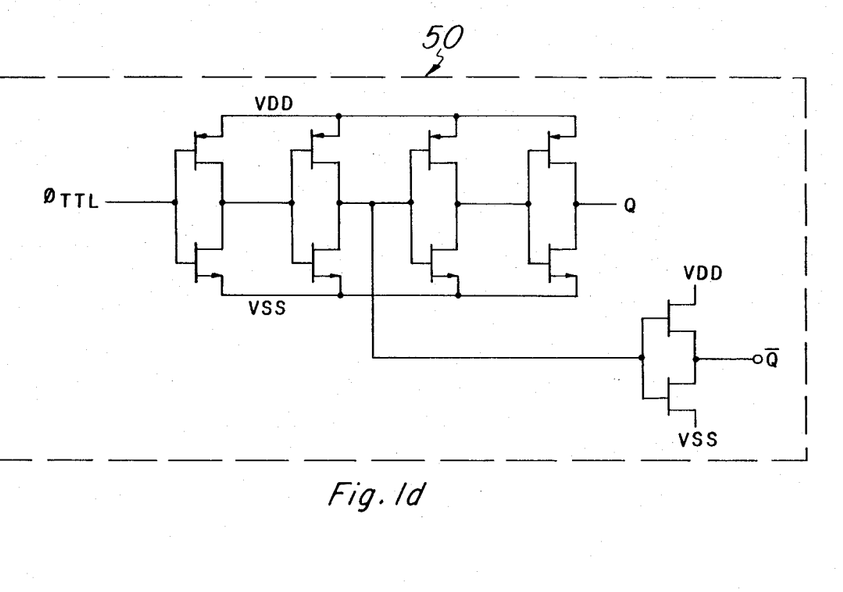

Next, a thin (175–225 Angstroms) of $SiO_2$ 88 (FIG. 2i) is grown on the poly silicon layer 86 and a 200 Angstrom layer of $Si_3N_4$ 90 deposited on the oxide layer 88 for a stacked capacitor 44 (FIG. 1c). A layer of positive resist 92 is patterned using mask 94 (FIG. 2i) and 200 Angstroms $SiO_2$, 200 Angstroms $Si_3N_4$ and 4800–5200 Angstroms poly silicon layers selectively etched away. After cleanup during which the resist 92 is removed from the stacked capacitor and the remaining oxide etched away, a 550–650 Angstroms thick $SiO_2$ layer is grown and a layer 96 of positive resist (FIG. 2j) is patterned using mask 98 for a boron implant. Boron is implanted at $4 \times 10^{11}/cm^3$ and 40 KeV energy to adjust the CMOS.

Next, a layer of negative resist 100 (FIG. 2k) is patterned using mask 102 for P-channel adjust. Boron implant is done at $4 \times 10^{11}$ with 40 KeV energy. It is to be noted that both the N-channel threshold adjust and P-channel adjust are done with boron; this raises the positive thresholds of the N-channel devices and makes less negative the thresholds of the p-channel transistors. The N-tank concentration at the surface is on the order of $1 \times 10^{16}/cm^3$ and the epitaxial concentration, in which the N-channel devices are built, is $1.5 \times 10^{15}/cm^3$.

Next, the resist 100 is replaced with a layer of negative resist 104 (FIG. 2l). The resist 104 is processed using mask 106 to pattern buried channel for CCD total active region implant. N-material (phosphorous, double charged) implantation is done at $3.8 \times 10^{12}$ with 100 KeV energy. After implantation the resist 104 is removed and 600 Angstroms of the oxide 76 etched away.

Next, a layer 108 (FIG. 2m) of negative resist is patterned for a clock well by mask 110 and N-material (arsenic) is ion implanted at areas 112 and 114. The arsenic implant is done at $1.8 \times 10^{12}/cm^3$ with 40 KeV energy. After the implantation the resist 106 is removed and a 600 Angstrom thick $SiO_2$ layer 116 (FIG. 2n) is grown.

Next, a 5000 Angstrom layer 118 of poly silicon is deposited and a negative resist layer (not shown) patterned by mask 120 and etched to form transistor gates and CCD clock gates. After the poly deposition the resist is removed.

Next, a layer 122 of negative resist (FIG. 2o) is patterned by mask 124 and phosphorus implants made at $5 \times 10^{15}$ with 130 KeV energy to form N+ source and drain regions 126, 128, 130 and 132. Then the resist layer 120 is stripped.

Next, a negative resist layer 134 (FIG. 2p) is patterned by P+ source/drain mask 136 and a $BF_2$ ion implant made to form P+ source and drain regions 138 and 140 and gate 140. The $BF_2$ implant is made at $4 \times 10^{15}/cm^3$ with 130 KeV energy. Then the resist layer 134 is stripped during cleanup. At this point the PMOS transistors are formed and the full CMOS circuitry finished.

The completion of the BCCDs 16 (FIG. 1a) is described as follows:

A layer 142 of negative resist (FIG. 2q) is patterned by N-virtual well mask 144 and a phosphorus (double charged) ion implant made at $4.2 \times 10^{12}$ with 100 KeV energy. Then the resist layer 142 is removed.

Next, a layer 146 of negative resist (FIG. 2r) is patterned by virtual phase adjust mask 148 and a phosphorus (double charged) ion implant made at $7.2 \times 10^{12}/cm^3$ with 105 KeV. This implant deepens the potential profile of the entire virtual phase region, barrier and well. The resist layer 146 is stripped.

Next, a layer 150 of negative resist (FIG. 2s) is patterned by virtual gate electrode mask 152 and P-material (boron) ion implant made at $8 \times 10^{12}/cm^3$ with 30 KeV. This implat is shallow and effectively pins the silicon surface to the epitaxial layer 56. Then the resist layer 150 is stripped.

Next, 1500 Angstroms±500 Angstroms of plasma oxide 154 is deposited; after anneal a 10,000 Angstrom oxide layer 156 is grown on the plasma oxide layer 154 (FIG. 2t).

Electrical contacts 158, 160, 162, 164, 166, 168, 170, 172, 174 and 176 are patterned on a negative layer of resist (not shown) covering the oxide layer 156 and etched through about 1.2 microns of the oxide. Then the resist is removed and a 400 Angstrom layer of sacrificial poly silicon deposited. Then about 75 Angstrom of the sacrificial poly silicon is etched away and about 1.2 micron metal (aluminum) deposited. The aluminum is patterned (not shown) and etched to form the contacts and the remaining surface sacrificial poly silicon layer etched away. Then the aluminum patterned resist is stripped and the aluminum sintered. Finally, 1 micron of a compressive nitride 178 is deposited, given a layer of resist patterned to form a protective nitride layer. Then the resist is stripped and 1.2 micron aluminum deposited, which is patterned (not shown) to form a second level aluminum 180 and etched to clear.

Figure 3:
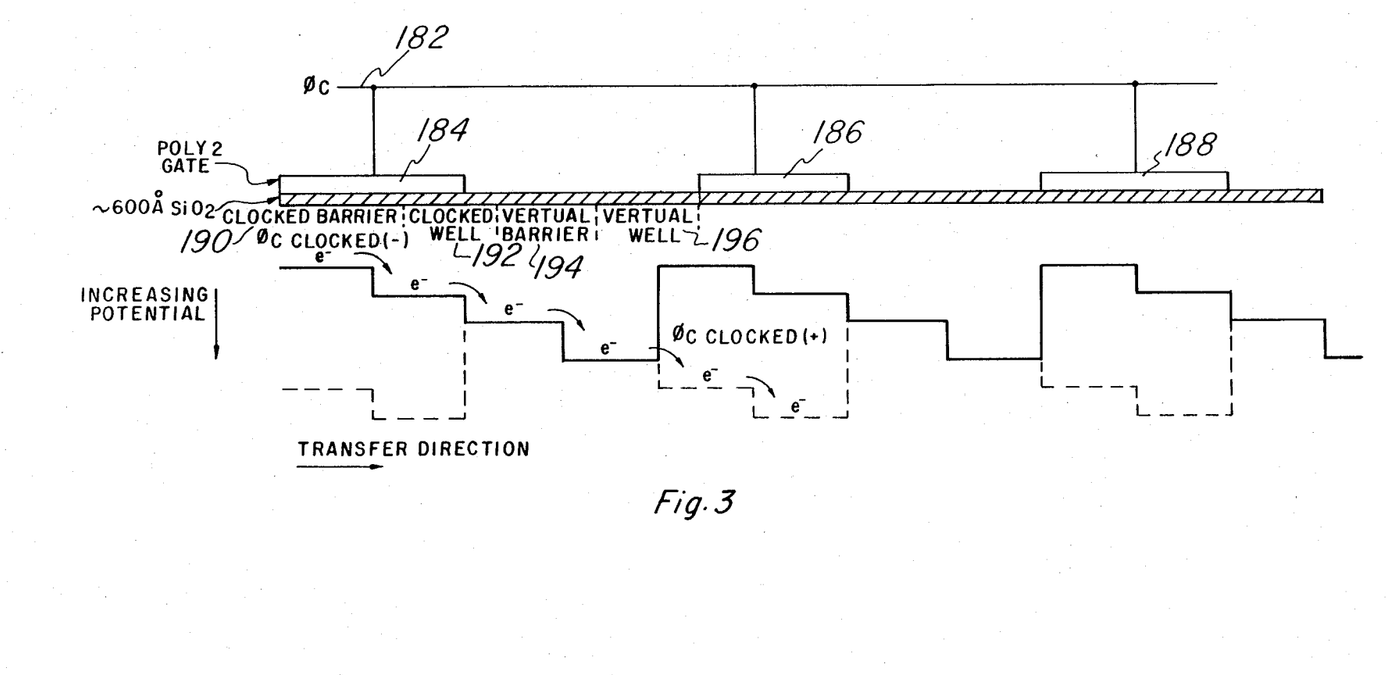
FIG. 3 is a view showing the CCD portion of the signal processor.

Referring now to FIG. 3, the completed serial read-parallel delay circuit CCD 16 (FIG. 1) includes the phase clock lead 182 connected to a clock (not shown) for controlling poly silicon 2 gate electrodes 184, 186 and 188. The gate electrodes 184, 186 and 188 are separated vertically from the clocked barrier 190 and clocked well 192 by the about 600 Angstrom thick oxide layer. In addition to the clocked barrier and clocked well regions 190 and 192, which are in the substrate beneath the gates, a virtual barrier region 194 and a virtual well region 196 in the substrate are defined by the space between the gates. The increasing potentials of the charges in the regions is shown in the chart of FIG. 3.

Although only a single embodiment of the invention has been described, it will be apparent to a person skilled in the art that various modifications to the details of construction shown and described may be made without departing from the scope of this invention.

What is claimed is:

1. A CTD/CMOS process comprising the steps of:
   (a) providing an epitaxial layer of a first type semiconductor material;
   (b) providing a tank of an opposite type semiconductor material in said epitaxial layer of first type semiconductor material for selected transistors of complementary (CMOS);
   (c) patterning a moat masking layer over the epitaxial layer;
   (d) ion implanting a selected type material through the moat for forming channel separations between N and P channel transistors, and isolation regions and channel stops for the charge transfer devices (CTDs);
   (e) growing an oxide layer over the epitaxial layer;
   (f) providing a first poly layer of a semiconductor material;
   (g) growing an oxide layer on the poly layer;
   (h) depositing a nitride layer on the oxide layer;
   (i) patterning the nitride layer and selectively etching the poly layer for a stacked capacitor;
   (j) patterning the nitride layer and ion implanting selected type material for both N-channel and P-channel threshold adjust;
   (k) ion implanting selected type material for forming buried channels for the CTDs;
   (l) providing CTD clock wells by ion implanting selected type material in the CTD regions;
   (m) providing a second level layer of poly semiconductor material selectively to complete the stacked capacitors and transistor gates CTD clock gates;
   (n) providing source and drain regions by ion implanting selected type materials for source and drain regions into the CMOS regions for completing the CMOS circuitry;
   (o) providing virtual phase regions in the CTD regions by ion implanting selected type material for deepening the potential profile of the virtual phase region, barrier and well for completing the CTD circuitry; and
   (p) providing electrical contacts for the CMOS and CTD circuitry.

2. A CCD/CMOS process for producing a signal processing apparatus comprising the steps of:
   (a) providing a silicon epitaxial layer;
   (b) providing an N-tank region for a P-channel MOSFET in said epitaxial layer;
   (c) growing $SiO_2$ layer on the epitaxial layer and depositing a $Si_3N_4$ layer on the $SiO_2$ layer;
   (d) patterning a moat over the epitaxial layer;
   (e) selectively masking the moat, etching the $Si_3N_4$ layer and providing a CCD pattern and ion implanting P-type material for forming channel separations between N and P channel transistors and for forming isolation regions and channel stops for the CCDs;
   (f) after cleanup including removal of the $Si_3N_4$ layer and at least 2000 Angstroms of the $SiO_2$, growing a layer of $SiO_2$ on the epitaxial layer;
   (g) providing a first poly silicon layer on the $SiO_2$ layer and an N-type ion implant made onto the $SiO_2$ layer;
   (h) growing a $SiO_2$ layer on the poly silicon layer and depositing a $Si_3N_4$ layer on the $SiO_2$ layer;
   (i) patterning the $Si_3N_4$ layer and etching the poly layer for a stacked capacitor;
   (j) patterning the $Si_3N_4$ layer and and ion implanting P-type material for both N-channel and P-channel threshold adjust;
   (k) after patterning, ion implanting an N-type material for forming buried channels for the CCDs;
   (l) providing CCD clock wells by ion implanting N-type material in the CCD regions:
   (m) providing a second level layer of poly silicon material selectively to complete the stacked capacitors, transistor gates and CCD clock gates;
   (n) providing source and drain regions by ion implanting N+ material P+ material, respectively, to form N+ source and drain regions and P+ source and drain regions for completing the CMOS circuitry;
   (o) providing virtual phase regions in the CCD regions by ion implanting N type material and for deepening the potential profile of the virtual phase region, barrier and well for completing the CCD circuitry; and
   (p) providing electrical contacts for the CMOS and CCD circuitry.

3. The CCD/CMOS process according to claim 2 wherein the silicon epitaxial layer includes a P+ silicon substrate and a 14–16 micron thick epitaxial P-type silicon layer formed on the silicon substrate.

4. The CCD/CMOS process according to claim 3 wherein at least 800 Angstroms of $SiO_2$ is grown on the epitaxial layer and has a 9–11 Ohm/cm resistivity.

5. The CCD/CMOS process according to claim 4 wherein at least 1400 Angstroms of $Si_3N_4$ is deposited on the $SiO_2$ layer.

6. The CCD/CMOS process according to claim 5 wherein the $Si_3N_4$ layer is patterned and etched away together with the corresponding portion of the $SiO_2$ layer and phosphorus ion implanted at a concentration of at least $5.5 \times 10^{12}/cm^3$ and 80 KeV to form the N-tank region.

7. The CCD/CMOS process according to claim 6 wherein the layer of $SiO_2$ includes a region at least 5300 Angstroms thick grown over the N-tank region with the remaining $Si_3N_4$ layer and corresponding $SiO_2$ etched away.

8. The CCD/CMOS process according to claim 2 wherein the $SiO_2$ layer further includes at least a 1100 Angstrom $SiO_2$ layer grown over the epitaxial layer including the silicon dioxide grown over the N-tank region and the $Si_3N_4$ layer deposited thereon is at least 1400 Angstroms thick.

9. The CCD/CMOS process according to claim 2 wherein the P-type material for channel separation between N and P channel transistors is boron implanted at $5.5\times 10^{12}/cm^3$ and 90 KeV and the P+ type material for the P+ isolation regions and channel stops for the CCD is boron implanted at $1.0\times 10^{14}/cm^3$ and 60 KeV.

10. The CCD/CMOS process according to claim 2 wherein the $SiO_2$ layer for the poly silicon layer and the poly silicon layer are, respectively, 550–650 Angstroms and 4800–5200 Angstroms thick.

11. The CCD/CMOS process according to claim 2 wherein the $SiO_2$ layer grown over the poly silicon is 175–225 Angstroms thick and the $Si_3N_4$ layer deposited on the $SiO_2$ layer is at least 200 Angstroms thick for the stacked capacitor.

12. The CCD/CMOS process according to claim 2 wherein the P-type material for both N-channel and P-channel threshold adjust is boron ion implanted at $4\times 10^{11}$ and 40 KeV.

13. The CCD/CMOS process according to claim 2 wherein the N-type material for forming the buried channels for the CCDs is phosphorus ion implanted at $3.8\times 10^{12}/cm^3$ and 100 KeV.

14. The CCD/CMOS process according to claim 2 wherein the N-type material for the CCD clock wells is arsenic ion implanted at $1.8\times 10^{12}/cm^3$ and 40 KeV.

15. The CCD/CMOS process according to claim 2 wherein the second level layer of poly silicon is provided by growing at least 600 Angstroms $SiO_2$, depositing at least 5000 Angstrom poly silicon on the $SiO_2$ and etching the poly silicon to form the stacked capacitors, transistor gates and CCD clock gates.

16. The CCD/CMOS process according to claim 2 wherein the N+ source and drain regions material is phosphorus ion implanted at $5\times 10^{15}$ and 130 KeV, and the P+ source and drain regions material is $BF_2$ ion implanted at $4\times 10^{15}/cm^3$ and 130 KeV.

17. The CCD/CMOS process according to claim 2 wherein the N type material for the virtual well is phosphorus ion implanted at $4.2\times 10^{12}/cm^3$ and 100 KeV.

18. The CCD/CMOS process according to claim 2 wherein the N-type material ion implanted in the CCD regions for deepening the potential profile of the virtual phase region, barrier and well for completing the CCD circuitry is phosphorus ion implanted at $7.2\times 10^{12}/cm^3$ and 105 KeV.

19. The CCD/CMOS process according to claim 2 wherein the electrical contacts for the CMOS and CCD circuitry are formed using aluminum.

* * * * *